United States Patent
Chen et al.

(10) Patent No.: US 8,363,037 B2
(45) Date of Patent: Jan. 29, 2013

(54) RESET CIRCUIT FOR POWER-ON AND POWER-OFF

(75) Inventors: Ying Lieh Chen, Tainan County (TW); Kai Lan Chuang, Tainan County (TW); Tsung Yu Wu, Tainan County (TW); Chien Ru Chen, Tainan County (TW); Chin Tien Chang, Tainan County (TW); Chuan Che Lee, Tainan County (TW); Wen Teng Fan, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 1101 days.

(21) Appl. No.: 11/835,268

(22) Filed: Aug. 7, 2007

(65) Prior Publication Data

US 2008/0278090 A1 Nov. 13, 2008

(30) Foreign Application Priority Data

May 9, 2007 (TW) ................................. 96116366 A

(51) Int. Cl.
*G09G 5/00* (2006.01)
(52) U.S. Cl. ............... 345/204; 345/76; 345/82; 345/87; 345/98; 345/100; 345/211; 315/226; 327/143
(58) Field of Classification Search .................. 345/76, 345/87, 98, 100, 204, 211, 82; 315/226; 327/143
See application file for complete search history.

(56) References Cited

U.S. PATENT DOCUMENTS

| | | | | |
|---|---|---|---|---|
| 5,248,963 A * | 9/1993 | Yasui et al. ................. 345/98 |
| 6,151,016 A * | 11/2000 | Kanbe et al. ............... 345/204 |
| 6,642,916 B1 * | 11/2003 | Kodama et al. ............ 345/100 |
| 6,693,614 B2 * | 2/2004 | Kamiya et al. ............. 345/89 |
| 6,731,258 B2 * | 5/2004 | Lin et al. .................... 345/87 |
| 6,961,034 B2 * | 11/2005 | Kusanagi .................... 345/87 |
| 7,154,491 B2 * | 12/2006 | Iwasaki ...................... 345/204 |
| 7,158,130 B2 * | 1/2007 | Lee et al. ................... 345/211 |
| 7,205,971 B2 * | 4/2007 | Baek et al. ................. 345/98 |
| 7,271,801 B2 * | 9/2007 | Toyozawa et al. .......... 345/211 |
| 7,505,019 B2 * | 3/2009 | Hirama ....................... 345/98 |

(Continued)

FOREIGN PATENT DOCUMENTS

| CN | 1862641 | 11/2006 |
|---|---|---|
| CN | 1862641 A | 11/2006 |

(Continued)

OTHER PUBLICATIONS

Taiwan Office Action dated Dec. 15, 2011 from Taiwan counterpart application.

(Continued)

*Primary Examiner* — Lun-Yi Lao
*Assistant Examiner* — Gregory J Tryder
(74) *Attorney, Agent, or Firm* — WPAT, P.C.; Anthony King

(57) ABSTRACT

A circuit for resetting a display having at least one driver outputting a driving voltage through an output channel to a corresponding data line of a panel comprises a first switch and a second switch. The first switch is actuated by a control pulse to transfer a reset voltage to the data line of the panel. The second switch is actuated by the control pulse to electrically isolate the output channel of the driver from the data line of the panel, wherein the control pulse is asserted during transient periods resulting from power-on and power-off of the display.

18 Claims, 6 Drawing Sheets

U.S. PATENT DOCUMENTS

| | | | |
|---|---|---|---|
| 7,825,919 B2* | 11/2010 | Woo et al. | 345/211 |
| 2001/0020928 A1* | 9/2001 | Yanagisawa et al. | 345/98 |
| 2002/0041279 A1* | 4/2002 | Chou | 345/211 |
| 2002/0126113 A1* | 9/2002 | Iwasaki | 345/211 |
| 2004/0036664 A1* | 2/2004 | Miyazawa | 345/76 |
| 2004/0104908 A1* | 6/2004 | Toyozawa et al. | 345/211 |
| 2004/0189629 A1* | 9/2004 | Fukutoku | 345/211 |
| 2005/0001825 A1* | 1/2005 | Huang | 345/204 |
| 2005/0017935 A1* | 1/2005 | Hirama | 345/87 |
| 2006/0007209 A1* | 1/2006 | Nakamura et al. | 345/204 |
| 2008/0062089 A1* | 3/2008 | Kim et al. | 345/76 |

FOREIGN PATENT DOCUMENTS

| | | |
|---|---|---|
| TW | 512300 | 12/2002 |
| TW | 512300 B | 12/2002 |

OTHER PUBLICATIONS

Taiwan Office Action issued on Dec. 15, 2011 from Taiwanese counterpart application 096116366 which cites US6151016, US20060007209, TW512300 and CN1862641.

* cited by examiner

RESET CIRCUIT FOR POWER-ON AND POWER-OFF

BACKGROUND OF THE INVENTION

1. Field of the Invention

The present invention relates to a reset circuit for power-on and power-off, and more particularly, to a reset circuit for power-on and power-off used in source drivers of an LCD (liquid crystal display) panel.

2. Description of the Related Art

Liquid crystal display (LCD) has the features being light, thin, small volume, low radiation, and saving power. These features allow the space used in the office or at home to decrease, as well as help reduce the eye fatigue due to staring at the LCD screen for too long. Therefore, in the planar display apparatus, LCD has the potential to replace the conventional CRT (cathode ray tube). FIG. 1 shows an LCD module used in an LCD monitor/TV. The LCD module includes a panel 2, a source driver unit 3, a gate driver unit 4 and a timing controller 5. The timing controller 5 controls the timing and sequence of display of a pixel of an image by sending control signals to the source driver unit 3 and the gate driver unit 4. Source drivers in the source driver unit 3 control the writing of pixel values into pixels (not shown) in the panel 2. Gate drivers in the gate driver unit 4 control the on/off operation of MOS transistors associated with the pixels by signals GS. When power-on and power-off of the LCD monitor/TV, the power supply and the signals from the timing controller 5 to the source driver unit 3 are usually unstable or in an unknown state. Thus, the output signals SS of the source driver unit 3 are in unknown states, resulting in a noise-like image on the panel 2.

To provide high quality image display and reduce the consumers' complaints, it is necessary to eliminate the noise-like image on the panel when power-on and power-off.

SUMMARY OF THE INVENTION

An aspect of the present invention is to provide a circuit for resetting a display when power-on and power-off, by outputting a driving voltage through an output channel to a corresponding data line of a panel based on the existing timings of an analog power supply and a digital power supply, to eliminate a noise-like image on the display.

Another aspect of the present invention is to provide a circuit for resetting a display when power-on and power-off, by outputting driving voltages through plural channels to corresponding data lines of a panel based on the existing timings of an analog power supply and a digital power supply, to eliminate a noise-like image on the display.

The first embodiment of the circuit for resetting a display according to the present invention includes a first switch and a second switch, wherein a driver outputs a driving voltage through an output channel to a corresponding data line of a panel. The first switch is actuated by a control pulse to transfer a reset voltage to the data line of the panel. The second switch is actuated by the control pulse to electrically isolate the output channel of the driver from the data line of the panel, wherein the control pulse is asserted during transient periods resulting from power-on and power-off of the display.

The second embodiment of the circuit for resetting a display according to the present invention includes a first switch, a second switch and a third switch, wherein a driver outputs driving voltages through a first and a second output channels to corresponding data lines of a panel. The first switch is actuated by a control pulse to electrically connect the first output channel and the second output channel. The second switch is actuated by the control pulse to electrically isolate the second output channel from the corresponding data line of the panel. The third switch is actuated by the control pulse so that a reset voltage is outputted through the first output channel, wherein the control pulse is asserted during transient periods resulting from power-on and power-off of the display.

BRIEF DESCRIPTION OF THE DRAWINGS

The invention will be described according to the appended drawings in which.

DETAILED DESCRIPTION OF THE INVENTION

Figure 1:
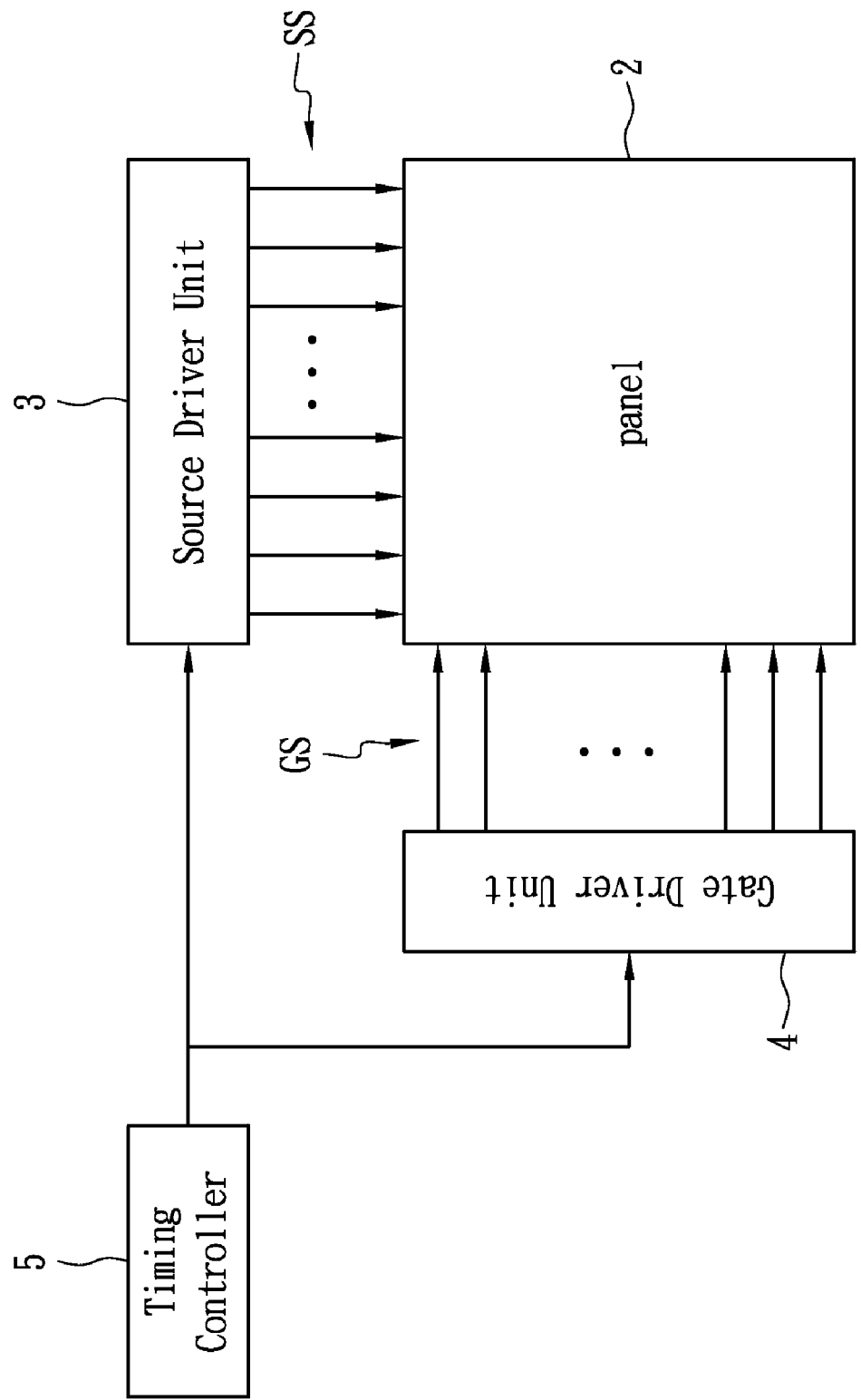
FIG. 1 shows an LCD module used in an LCD monitor/TV.
Figure 2:
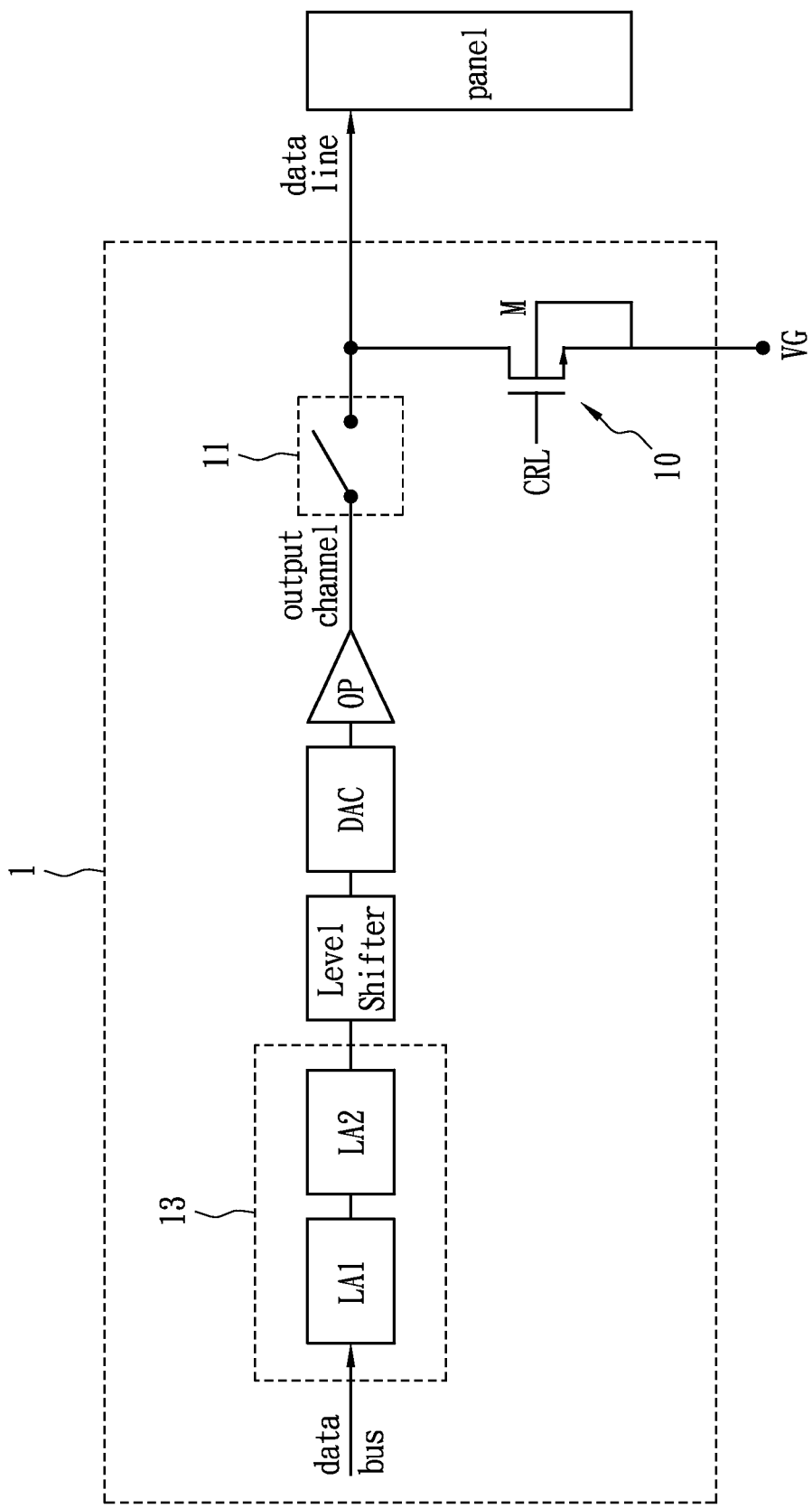
FIG. 2 shows the first embodiment of the circuit for resetting a display according to the present invention.

FIG. 2 shows the first embodiment of the circuit for resetting a display according to the present invention. The display is equipped with at least one driver 1, each driver 1 outputting a driving voltage (equivalent to the data on the data bus) through an output channel to a corresponding data line of a panel. Despite the driver 1 includes plural output channels and plural corresponding data lines in real applications, only one output channel and one data line are shown in FIG. 2 for the purpose of illustration. The circuit includes a first switch 10 (a MOS transistor in the current embodiment) and a second switch 11. The first switch 10 is actuated by a control pulse CRL to transfer a reset voltage VG to the date line of the panel. The second switch 11 is actuated by the control pulse CRL to electrically isolate the output channel of the driver 1 from the data line of the panel, wherein the control pulse CRL is asserted during transient periods resulting from power-on and power-off of the display.

Figure 3:
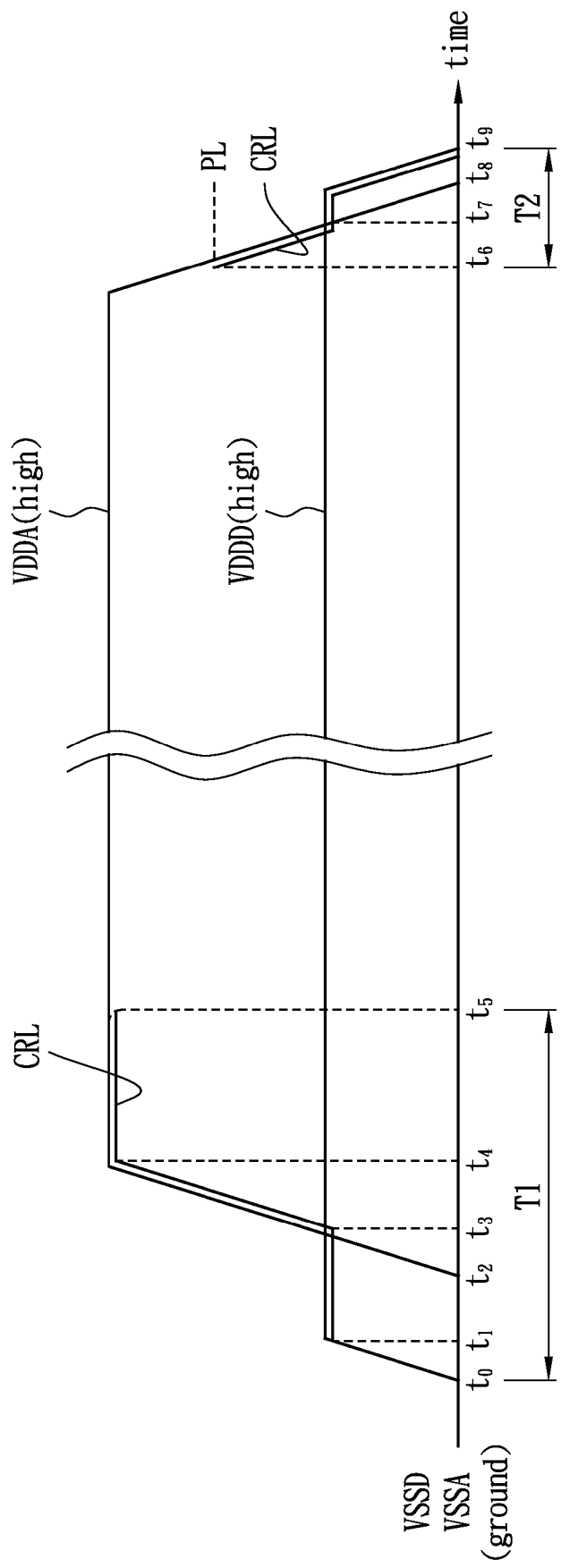
FIG. 3 shows the timing chart of the control pulse and the signals regarding a power on/off sequence of the display.

FIG. 3 shows the timing chart of the control pulse CRL and the signals regarding a power on/off sequence of the display. The transient period T1 resulting from power-on of the display ends before the first latched data is outputted from a line buffer 13 of the driver 1. The transient period T2 resulting from power-off of the display starts when a level of an analog power supply VDDA (e.g., ranging from 0V to 8.0V or 13.5V) decreases to a predetermined level PL. The level of the control pulse CRL changes according to the analog power supply VDDA and a digital power supply VDDD (e.g., ranging from 0V to 2.3V or 3.6V). When the transient period T1 starts, the level of the control pulse CRL increases from a ground level (VSSD or digital ground) to a high level of the digital power supply VDDD from time $t_0$ time $t_1$, and then remains at the high level of the digital power supply VDDD from $t_1$ to time $t_3$. Meanwhile, the level of the analog power supply VDDA increases from the ground level (VSSA or analog ground) to a high level of the analog power supply VDDA from time $t_2$ time $t_4$, in which time $t_2$ leads time $t_3$ At time $t_3$, the level of the control pulse CRL changes to follow the analog power supply VDDA and increases to a high level of the analog power supply VDDA at time $t_4$, and remains at the high level of the analog power supply VDDA from time $t_4$ to time $t_5$. The transient period T2 starts from time $t_6$ when the level of the analog power supply VDDA decreases to the predetermined level PL. At the same time, the control pulse CRL is generated with a level of the predetermined level PL.

Then, the level of the control pulse CRL follows the analog power supply VDDA to decrease until the high level of the digital power supply VDDD is reached at time $t_7$. The level of the control pulse CRL remains at the high level of the digital power supply VDDD from time $t_7$ to time $t_8$. Finally, the level of the control pulse CRL decreases to the ground level VSSD at time $t_9$ that lags time $t_8$. Note that the control pulse CRL could be generated by the driver 1 or by the timing controller of the display. Also, the reset voltage VG could be an external constant voltage provided from outside of the driver 1.

Referring back to FIGS. 2 and 3, when power-on of the display, the transient period T1 starts and the control pulse CRL is generated to turn on the first switch 10 to transfer the reset voltage VG to the data line of the panel. At the same time, the second switch 11 is actuated by the control pulse CRL to electrically isolate the output channel of the driver 1 from the data line of the panel. The control pulse CRL is disabled at time $t_5$ and then the first latched data is outputted from the line buffer 13 of the driver 1 to a level shifter. Therefore, all the outputs of the driver 1 have the same level; that is, the reset voltage VG. Accordingly, the noise-like image on the display is eliminated. In a similar way, when power-off of the display, the transient period T2 starts at time t6 and the control pulse CRL is generated to turn on the first switch 10 to transfer the reset voltage VG to the data line of the panel. At the same time, the second switch 11 is actuated by the control pulse CRL to electrically isolate the output channel of the driver 1 from the data line of the panel. Therefore, when the control pulse CRL is actuated high during the transient periods T1 and T2, all the outputs of the driver 1 have the same level; that is, the reset voltage VG. Accordingly, the noise-like image on the display is eliminated. The reset voltage VG could be a gamma voltage provided from the driver 1 and is within the range of the analog power supply VDDA (e.g., from 0V to 13.5V).

Figure 4:
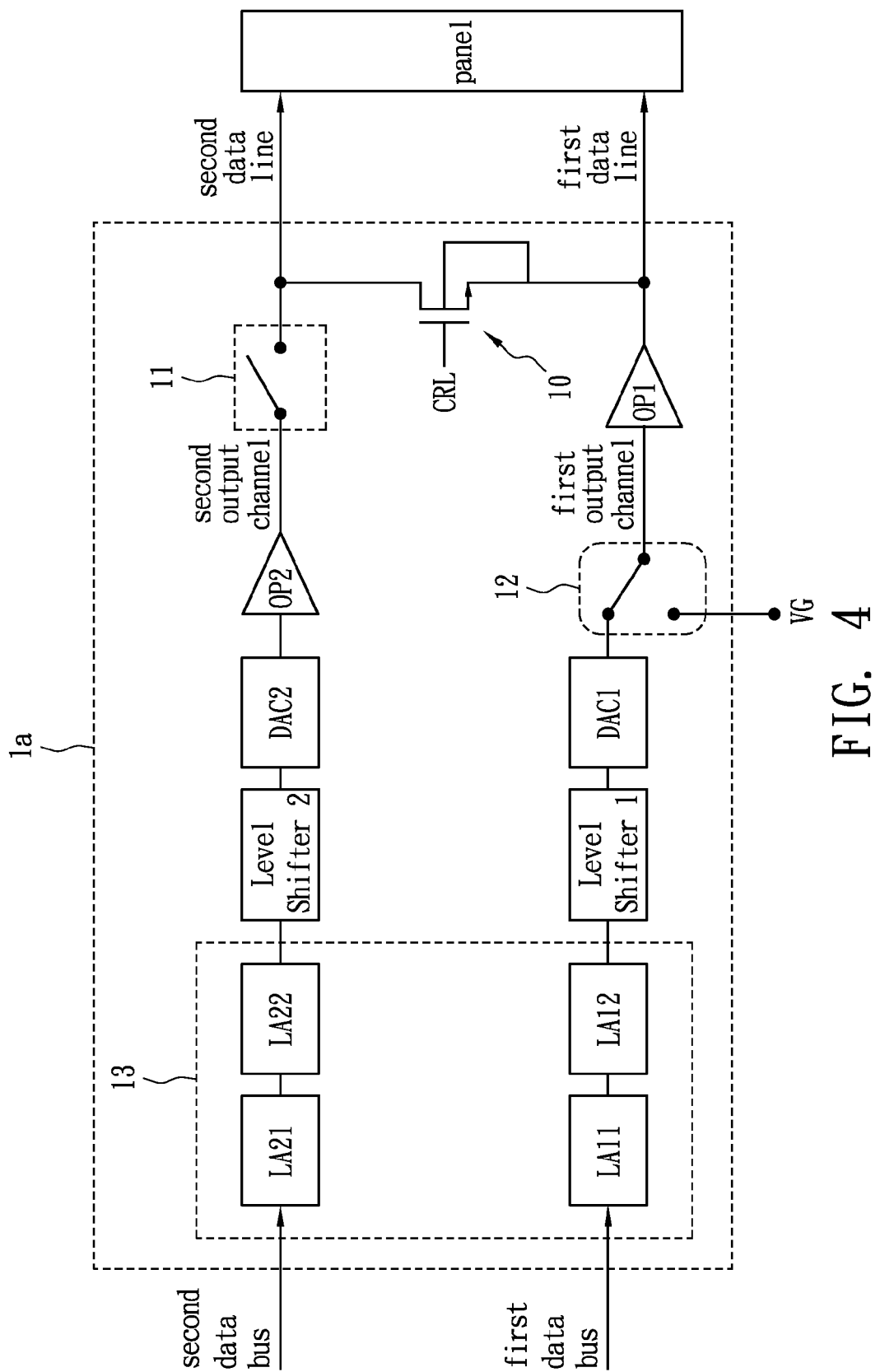
FIGS. 4-6 show the second, third and fourth embodiments of the circuit for resetting a display according to the present invention.

FIG. 4 shows the second embodiment of the circuit for resetting a display according to the present invention. The display is equipped with at least one driver 1a, each driver 1a outputting driving voltages through a first and a second output channels to corresponding data lines of a panel. Despite the driver 1a includes plural output channels and plural corresponding data lines in real applications, only two output channels and two data lines are shown in FIG. 4 for the purpose of illustration. The circuit includes a first switch 10 (a MOS transistor in the current embodiment), a second switch 11 and a third switch 13. The first switch 10 is actuated by a control pulse CRL to electrically connect the first output channel and the second output channel. The second switch 11 is actuated by the control pulse CRL to electrically isolate the second output channel from the first and the second data lines of the panel. The third switch 12, coupled between a digital-to-analog converter DAC1 and an output buffer OP1 of the driver 1a, is actuated by the control pulse CRL so that a reset voltage VG is outputted through the first output channel, wherein the control pulse CRL is asserted during transient periods resulting from power-on and power-off of the display. The operation of the second embodiment in FIG. 4 is similar to that of the first embodiment in FIG. 2. That is, the timing chart of FIG. 3 is also applicable to the second embodiment. Moreover, when the third switch 12 is deactivated, the driving voltage on the first data bus is outputted through the first output channel. Therefore, when the control pulse CRL is actuated high during the transient periods T1 and T2, all the outputs of the driver 1a have the same level; that is, the reset voltage VG. Accordingly, the noise-like image on the display is eliminated.

Figure 5:
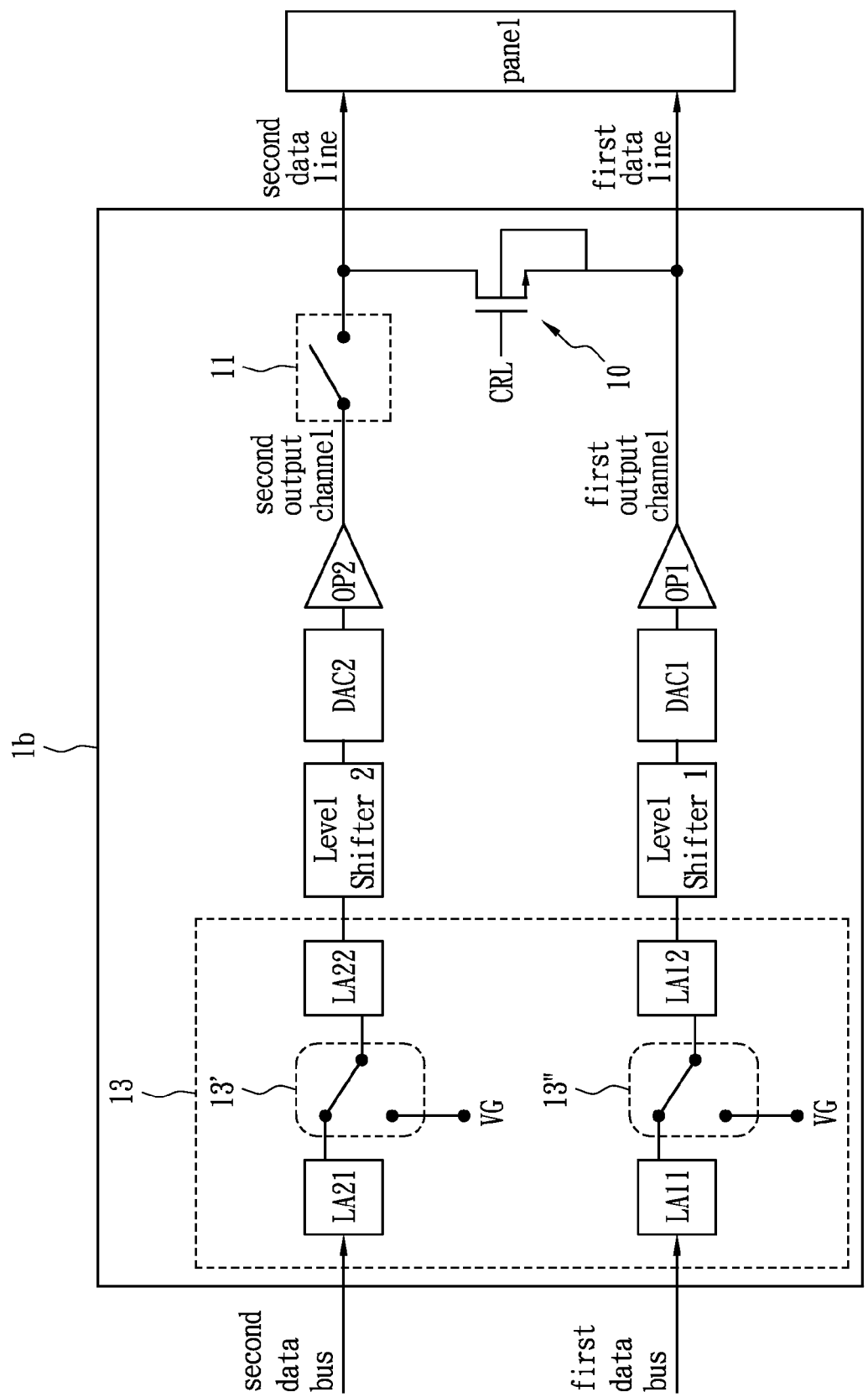

FIG. 5 shows the third embodiment of the circuit for resetting a display according to the present invention. The display is equipped with at least one driver 1b, each driver 1b outputting driving voltages through a first and a second output channels to corresponding data lines of a panel. Despite the driver 1b includes plural output channels and plural corresponding data lines in real applications, only two output channels and two data lines are shown in FIG. 5 for purpose of simplification of illustration. The circuit includes a first switch 10 (a MOS transistor in the current embodiment), a second switch 11, a third switch 13" and a fourth switch 13'. The first switch 10 is actuated by a control pulse CRL to electrically connect the first output channel and the second output channel. The second switch 11 is actuated by the control pulse CRL to electrically isolate the second output channel from the first and the second data lines of the panel. The third switch 13" is actuated by the control pulse CRL so that a reset voltage VG is outputted through the first output channel. The fourth switch 13' is actuated by the control pulse CRL so that the reset voltage VG is outputted through the second output channel. Also, the timing chart of FIG. 3 is applicable to the third embodiment. Moreover, when the third switch 13" and the fourth switch 13' are deactivated, the driving voltages on the first and the second data buses are outputted through the first and the second output channels, respectively. Therefore, when the control pulse CRL is actuated high during the transient periods T1 and T2, all the outputs of the driver 1c have the same level; that is, the reset voltage VG. Accordingly, the noise-like image on the display is eliminated. Note that, in other embodiment of the circuit, the third switch 13" is configured to be coupled between a first latch LA 11 and a second latch LA12 of the driver 1b.

Figure 6:
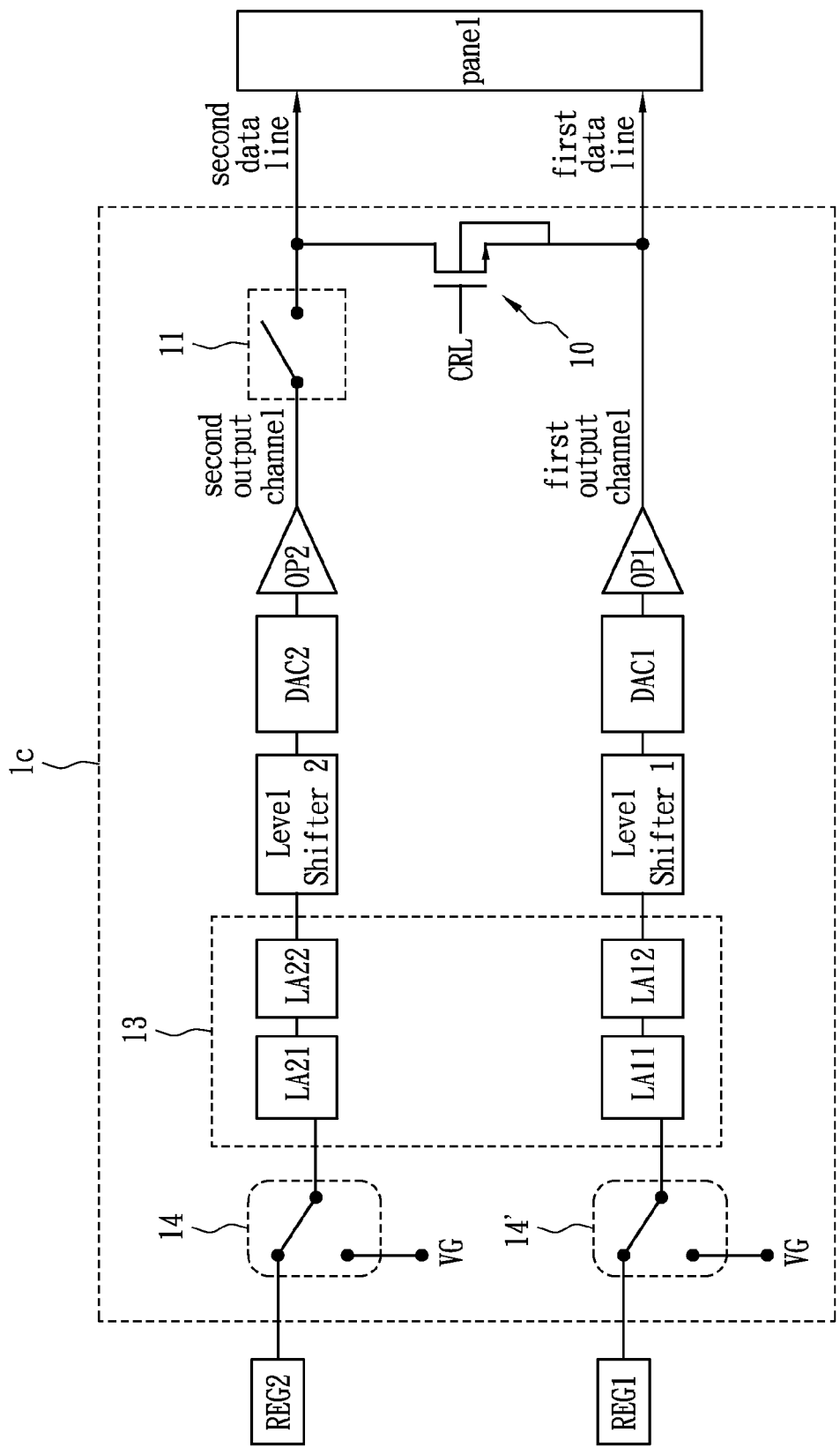

FIG. 6 shows the fourth embodiment of the circuit for resetting a display according to the present invention. The configuration of the fourth embodiment is similar to that of the third embodiment except that the third switch 14' is coupled between a first shift register REG1 and a latch 13, and the fourth switch 14 is coupled between a second shift register REG2 and the latch 13.

For the above embodiments, the reset voltage VG could be a gamma voltage provided from the driver and is within the range of the analog power supply (e.g., from 0V to 13.5V). Also, the reset voltage could be an external constant voltage and the control pulse could be generated by a timing controller or the driver of the display. The MOS transistor (i.e., the first switch) receives the control pulse at the gate thereof.

According to the above embodiments, all the outputs of the driver(s) of the panel have the same voltage level (i.e., a reset voltage) during power-on and power-off of the display, which is based on the existing timings of an analog power supply and a digital power supply. Accordingly, the noise-like image on the panel is eliminated.

The above-described embodiments of the present invention are intended to be illustrative only. Numerous alternative embodiments may be devised by those skilled in the art without departing from the scope of the following claims.

What is claimed is:

1. A circuit for resetting a display having at least one driver outputting a driving voltage through an output channel to a corresponding data line of a panel, the circuit comprising:
   a first switch actuated by a control pulse to transfer a reset voltage to the data line of the panel; and
   a second switch actuated by the control pulse to electrically isolate the output channel of the driver from the data line of the panel;

wherein the control pulse is asserted during transient periods resulting from power-on and power-off of the display, wherein the transient period resulting from the power-on of the display starts when a digital power supply increases, continues when the digital power supply becomes stable, when an analog power supply increases and when an analog power supply becomes stable, and ends before the first latched data is outputted from a line buffer of the driver, wherein the transient period resulting from the power-off of the display starts when a level of the analog power supply decreases to a predetermined level, wherein the reset voltage is within a range of the analog power supply.

2. The circuit of claim 1, wherein the control pulse is generated by a timing controller of the display.

3. The circuit of claim 1, wherein the control pulse is generated by the driver.

4. The circuit of claim 1, wherein the reset voltage is an external constant voltage.

5. The circuit of claim 1, wherein the first switch is a MOS transistor receiving the control pulse at the gate thereof.

6. A circuit for resetting a display having at least one driver outputting driving voltages through a first and a second output channels to corresponding data lines of a panel, the circuit comprising:

a first switch actuated by a control pulse to electrically connect the first output channel and the second output channel;

a second switch actuated by the control pulse to electrically isolate the second output channel from the corresponding data lines of the panel; and a third switch actuated by the control pulse so that a reset voltage is outputted through the first output channel;

wherein the control pulse is asserted during transient periods resulting from power-on and power-off of the display, wherein the transient period resulting from the power-on of the display starts when a digital power supply increases, continues when the digital power supply becomes stable, when an analog power supply increases and when an analog power supply becomes stable, and ends before the first latched data is outputted from a line buffer of the driver, wherein the transient period resulting from the power-off of the display starts when a level of the analog power supply decreases to a predetermined level, wherein the reset voltage is within a range of the analog power supply.

7. The circuit of claim 6, wherein one of the driving voltages is outputted through the first output channel when the third switch is deactivated.

8. The circuit of claim 6, wherein the third switch is coupled between a DAC and an output buffer of the driver.

9. The circuit of claim 6, wherein the third switch is coupled between a first latch and a second latch of the driver.

10. The circuit of claim 6, wherein the third switch is coupled between a shift register and a latch of the driver.

11. The circuit of claim 6, wherein the control pulse is generated by a timing controller of the display.

12. The circuit of claim 6, wherein the control pulse is generated by the driver.

13. The circuit of claim 6, wherein the reset voltage is an external constant voltage.

14. The circuit of claim 6, wherein the first switch is a MOS transistor receiving the control pulse at the gate thereof.

15. The circuit of claim 6, further comprising a fourth switch actuated by the control pulse so that the reset voltage is outputted through the second output channel.

16. The circuit of claim 15, wherein the driving voltages are outputted through the first and second output channels when the third switch and the fourth switch are deactivated, respectively.

17. The circuit of claim 15, wherein the fourth switch is coupled between a first latch and a second latch of the driver.

18. The circuit of claim 15, wherein the fourth switch is coupled between a shift register and a latch of the driver.

* * * * *